US012494441B2

(12) United States Patent
Geng et al.

(10) Patent No.: US 12,494,441 B2
(45) Date of Patent: Dec. 9, 2025

(54) BGA STIFFENER ATTACHMENT WITH LOW EOLIFE ADHESIVE STRENGTH AT HIGH SOLDER JOINT STRESS AREA GENERATED FROM ENABLING LOAD

(71) Applicant: Intel Corporation, Santa Clara, CA (US)

(72) Inventors: Phil Geng, Washougal, WA (US); Patrick Nardi, Scottsdale, AZ (US); Ravindranath V. Mahajan, Chandler, AZ (US); Dingying David Xu, Chandler, AZ (US); Prasanna Raghavan, Chandler, AZ (US); John Harper, Chandler, AZ (US); Sanjoy Saha, Portland, OR (US); Yang Jiao, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 749 days.

(21) Appl. No.: 17/703,768

(22) Filed: Mar. 24, 2022

(65) Prior Publication Data

US 2023/0307379 A1 Sep. 28, 2023

(51) Int. Cl.
*H01L 23/10* (2006.01)
*H01L 23/00* (2006.01)
*H01L 23/34* (2006.01)
*H01L 23/498* (2006.01)

(52) U.S. Cl.
CPC ...... *H01L 23/562* (2013.01); *H01L 23/49816* (2013.01)

(58) Field of Classification Search
CPC ............ H01L 23/562; H01L 23/49816; H01L 23/3128; H01L 23/36; H01L 23/16
USPC ........................................ 257/706
See application file for complete search history.

(56) References Cited

U.S. PATENT DOCUMENTS

| | | | | |
|---|---|---|---|---|
| 2007/0210438 A1* | 9/2007 | Briere | ................ | H01L 23/367 257/E23.092 |
| 2011/0304032 A1* | 12/2011 | Ramos | ................ | H01L 21/568 438/119 |
| 2020/0126882 A1* | 4/2020 | Jang | ................ | H01L 23/49816 |

* cited by examiner

*Primary Examiner* — Theresa T Doan
(74) *Attorney, Agent, or Firm* — Schwabe, Williamson & Wyatt P.C.

(57) ABSTRACT

Embodiments disclosed herein include an electronic package. In an embodiment, the electronic package comprises a package substrate, and a die coupled to the package substrate. In an embodiment, the electronic package further comprises a stiffener on the package substrate surrounding the die. In an embodiment, the stiffener is a ring with one or more corner regions and one or more beams. In an embodiment, each beam is between a pair of corner regions, and the one or more corner regions have a first thickness and the one or more beams have a second thickness that is greater than the first thickness.

25 Claims, 10 Drawing Sheets

BGA STIFFENER ATTACHMENT WITH LOW EOLIFE ADHESIVE STRENGTH AT HIGH SOLDER JOINT STRESS AREA GENERATED FROM ENABLING LOAD

TECHNICAL FIELD

Embodiments of the present disclosure relate to electronic packages, and more particularly to electronic packages with stiffeners that include recesses at corner regions in order to reduce solder joint stress.

BACKGROUND

With the increasing thickness of package substrate stiffeners, the thermal-mechanical enabling component stack can cause issues with ball grid array (BGA) corner and edge solder joint failure during temperature test operations. The BGA stiffener is used to reduce substrate warpage of large size BGA systems during surface mount technology (SMT) reflow and other processes. In some instances an enabling component stack is provided over the stiffener. This additional enabling component stack has resulted in solder joint failure, particularly at the corners of the BGA system. The effect of the enabling parts is significant and causes one side of the BGA solder joint to crack at early temperature cycles. Particularly, it has been shown that the combination of the enabling component stack and the stiffener results in significantly increased solder joint stress. One approach to mitigate the stress is to use a thinner stiffener. However, reducing the thickness of the stiffener increases SMT warpage related risks.

EMBODIMENTS OF THE PRESENT DISCLOSURE

Figure 1A:
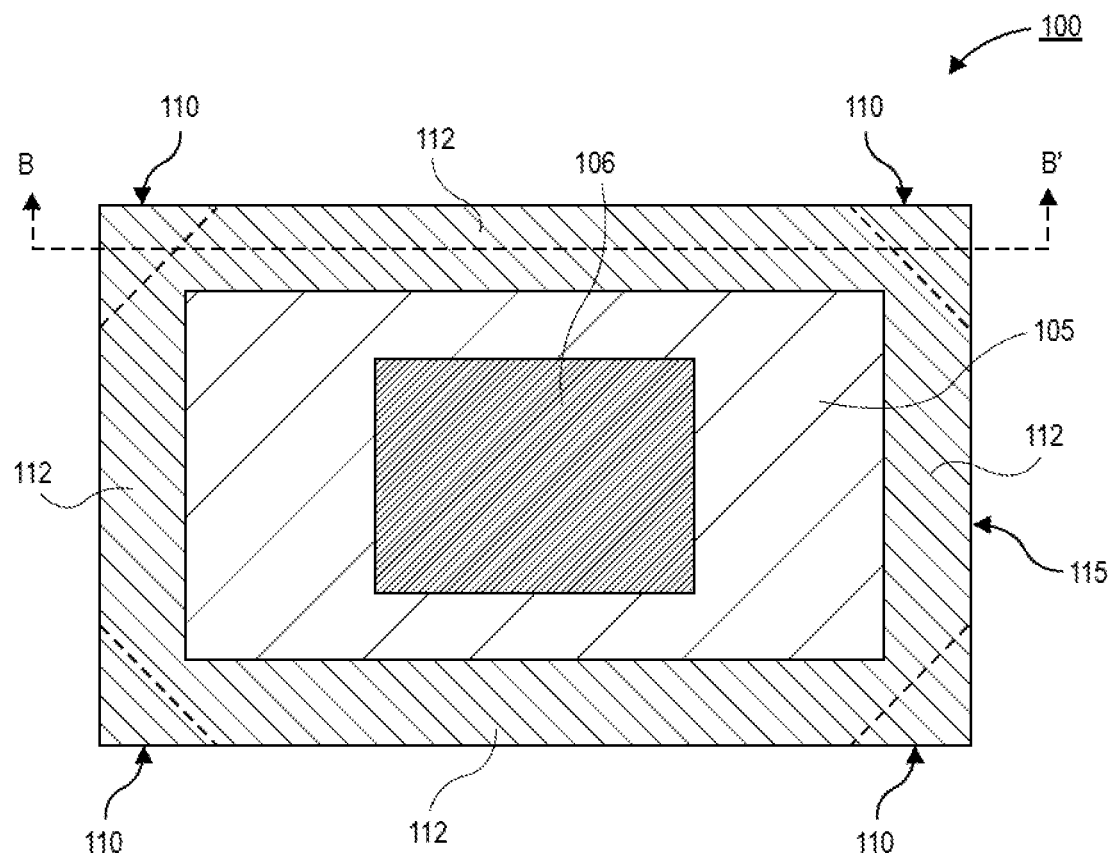
FIG. 1A is a plan view illustration of an electronic package with a stiffener that has corner regions with reduced thicknesses, in accordance with an embodiment.

Described herein are electronic packages with stiffeners that include recesses at corner regions in order to reduce solder joint stress, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, thicker stiffeners enable a reduction in the warpage of the package substrate. However, thicker stiffeners also result in increased stress at corner locations of the BGA field. Accordingly, embodiments disclosed herein include stiffeners that are designed to have corner regions that are thinner than the rest of the stiffener. For example, corner regions may be connected to each other by beams. The corner regions may have a first thickness and the beams may have a second thickness that is greater than the first thickness. As such, the benefits of thin stiffeners to the corners of the BGA field are realized without significantly detracting from the warpage control provided by the stiffener.

In an embodiment, the corner regions may be triangular shaped recesses at the corner of the stiffener. In other embodiments, the corner regions may include L-shaped recesses. In yet another embodiment, the corner regions may include a plurality of recesses (e.g., circular recesses). The recesses may be formed into the top surface of the stiffener. In other embodiments, the recesses may be formed into the bottom surface of the stiffener. Instead of using recesses, other embodiments may include cutouts at the corner regions. That is, the portion of the stiffener at the corner region may be omitted all together.

In some instances the solder balls under the corner regions may also be larger than the solder balls in the rest of the BGA field. The larger solder balls may further mitigate the BGA corner solder joint stress during temperature cycling due to stiffener interaction with the enabling thermal-mechanical solution. In some instances, the larger solder balls are mechanical connections only. That is, the larger solder balls are not coupled to active circuitry of the semiconductor package. As such, shorts between neighboring large solder balls is not a concern.

Referring now to FIG. 1A, a plan view illustration of an electronic package 100 is shown, in accordance with an embodiment. In an embodiment, the electronic package 100 may include a package substrate 105. The package substrate 105 may include a plurality of dielectric layers with conductive features (e.g., traces, vias, pads, etc.) embedded therein. In an embodiment, the package substrate 105 is coreless. In other embodiments, the package substrate 105 may include a core (e.g., a glass fiber reinforced dielectric layer).

In an embodiment, a die 106 may be coupled to the package substrate 105. The die 106 may be any type of active semiconductor device. For example, the die 106 may include a processor, a graphics processor, a memory, or the like. Additionally, while a single die 106 is shown in FIG. 1A, it is to be appreciated that multiple dies 106 may be provided adjacent to each other and/or in a vertical stack. In an embodiment, the die 106 may have a footprint that is smaller than a footprint of the package substrate 105. The die 106 may be coupled to the package substrate 105 with first level interconnects (FLIs), which are not visible in FIG. 1A.

In an embodiment, a stiffener 115 may be provided around a perimeter of the die 106. The stiffener 115 may be a ring that includes a center cutout in order to accommodate the die 106. The cutout may be larger than the footprint of the die 106. As such, portions of the package substrate 105 may be visible between the die 106 and the stiffener 115.

The stiffener 115 may have one or more corner regions 110. As shown, a set of four corner regions 110 are provided in the stiffener 115 of FIG. 1A. Each of the corner regions may be between beams 112. That is, beams 112 of the stiffener 115 may couple together adjacent corner regions 110. In an embodiment, the corner regions 110 may have a thickness that is less than a thickness of the beams 112. In a particular embodiment, the corner regions 110 may have a thickness that is half the thickness of the beams 112 or less. In some embodiments, the thickness of the corner regions 110 is a quarter or less of the thickness of the beams 112. As such, localized regions of the stiffener 115 can have small thicknesses in order to reduce BGA ball stress, while the remainder of the stiffener 115 remains thick in order to provide excellent warpage control for the underlying package substrate.

In the particular embodiment shown in FIG. 1A, the corner regions 110 have a triangular shape. In some instances, the corner regions 110 are right triangles with a hypotenuse that extends from a first edge of the stiffener 115 to a second edge of the stiffener 115. The lengths of the legs of the triangle on the first edge of the stiffener and the second edge of the stiffener 115 may be substantially equal to each other. In other embodiments the legs of the triangle may not be substantially equal to each other. In an embodiment, the hypotenuse may be between an inner corner of the stiffener 115 and an outer corner of the stiffener 115. In other embodiments, the hypotenuse may contact the inner corner of the stiffener 115. As shown, the corner regions 110 are formed as recesses into the top surface of the stiffener 115. That is, a bottom surface of the corner regions 110 may be substantially coplanar with the bottom surface of the beams 112.

Figure 1B:
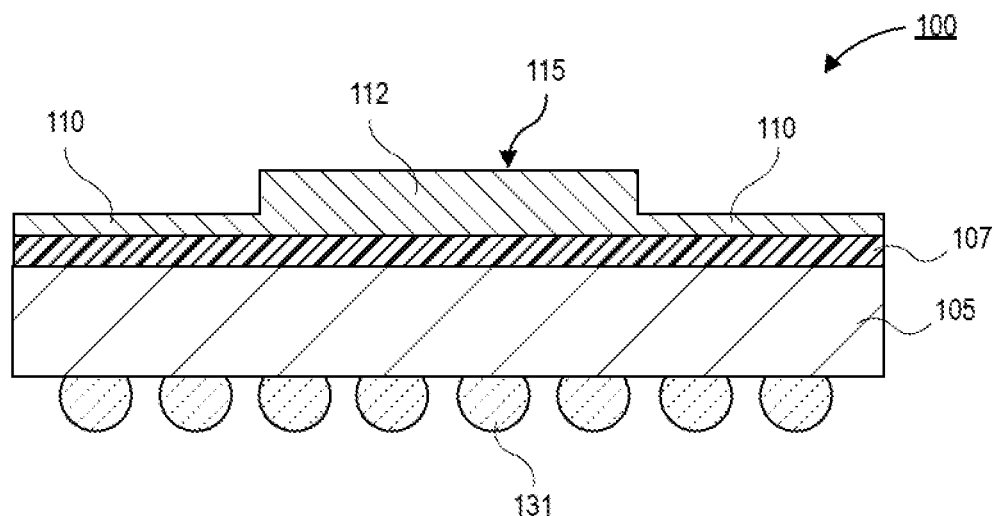
FIG. 1B is a cross-sectional illustration of an electronic package with a stiffener that has corner regions with reduced thicknesses, in accordance with an embodiment.

Referring now to FIG. 1B, a cross-sectional illustration of the electronic package 100 in FIG. 1A along line B-B' is shown, in accordance with an embodiment. As shown, the stiffener 115 may be mechanically coupled to the package substrate 105 by an adhesive 107. The adhesive 107 may extend along an entire bottom surface of the stiffener 115. That is, the adhesive 107 may be provided below the beam 112 and the corner regions 110.

As shown, the stiffener 115 includes corner regions 110 that have a thickness that is less than a thickness of the beam 112. The thicknesses of the corner regions 110 may be reduced by providing recesses into the top surface of the corner regions 110. That is, the top surface of the beam 112 may be above the top surface of the corner regions 110. However, as noted above, the bottom surface of the beam 112 may be substantially coplanar with a bottom surface of the corner regions 110.

In an embodiment, solder balls 131 may be provided on a bottom surface of the package substrate 105. The solder balls 131 may be BGA balls in some embodiments. The solder balls 131 may have substantially uniform spacings and dimensions. The reduction in the thickness of the corner regions 110 may result in the stress on the solder balls 131 being reduced, especially in the solder balls 131 that are provided under the corner regions 110.

Figure 1C:
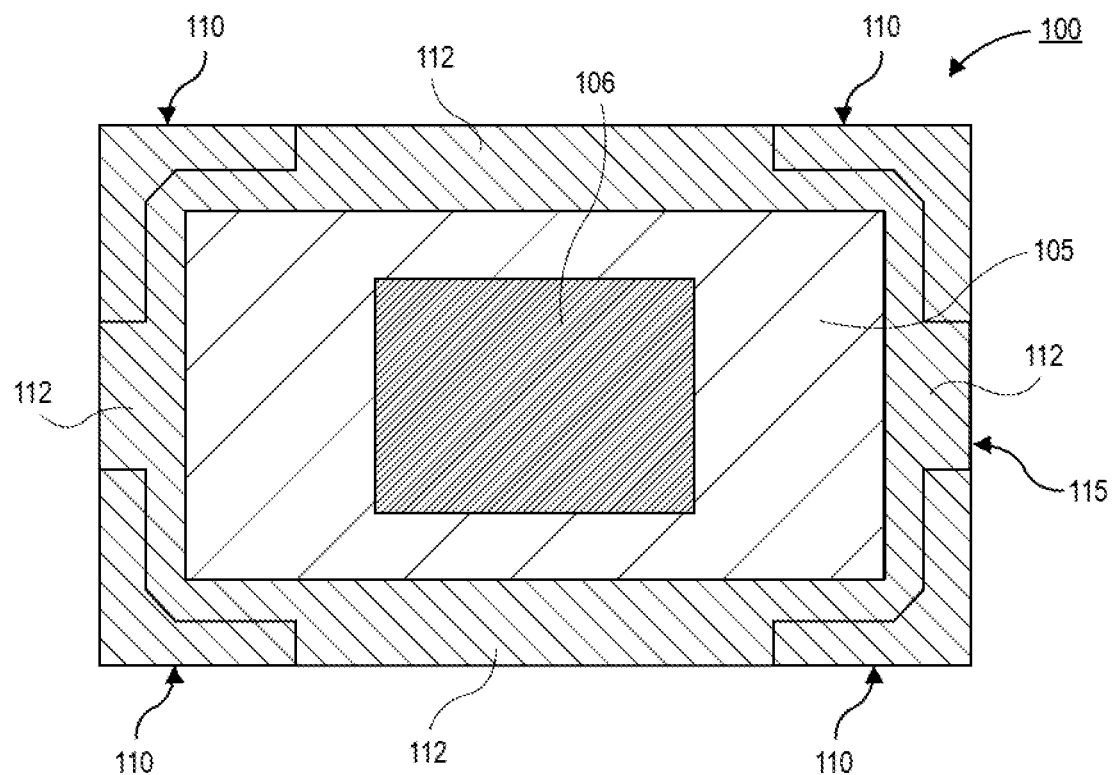
FIG. 1C is a plan view illustration of an electronic package with a stiffener that has L-shaped corner regions with reduced thicknesses, in accordance with an embodiment.

Referring now to FIG. 1C, a plan view illustration of an electronic package 100 is shown, in accordance with an embodiment. In an embodiment, the electronic package 100 may include a package substrate 105. The package substrate 105 may include a plurality of dielectric layers with conductive features (e.g., traces, vias, pads, etc.) embedded therein. In an embodiment, the package substrate 105 is coreless. In other embodiments, the package substrate 105 may include a core (e.g., a glass fiber reinforced dielectric layer).

In an embodiment, a die 106 may be coupled to the package substrate 105. The die 106 may be any type of active semiconductor device. For example, the die 106 may include a processor, a graphics processor, a memory, or the like. Additionally, while a single die 106 is shown in FIG. 1C, it is to be appreciated that multiple dies 106 may be provided adjacent to each other and/or in a vertical stack. In an embodiment, the die 106 may have a footprint that is smaller than a footprint of the package substrate 105. The die 106 may be coupled to the package substrate 105 with first level interconnects (FLIs), which are not visible in FIG. 1C.

In an embodiment, a stiffener 115 may be provided around a perimeter of the die 106. The stiffener 115 may be a ring that includes a center cutout in order to accommodate the die 106. The cutout may be larger than the footprint of the die 106. As such, portions of the package substrate 105 may be visible between the die 106 and the stiffener 115.

The stiffener 115 may have one or more corner regions 110. As shown, a set of four corner regions 110 are provided in the stiffener 115 of FIG. 1C. Each of the corner regions may be between beams 112. That is, beams 112 of the stiffener 115 may couple together adjacent corner regions 110. In an embodiment, the corner regions 110 may have a thickness that is less than a thickness of the beams 112. In a particular embodiment, the corner regions 110 may have a thickness that is half the thickness of the beams 112 or less. In some embodiments, the thickness of the corner regions 110 is a quarter or less of the thickness of the beams 112. As such, localized regions of the stiffener 115 can have small thicknesses in order to reduce BGA ball stress, while the remainder of the stiffener 115 remains thick in order to provide excellent warpage control for the underlying package substrate.

In the particular embodiment shown in FIG. 1C, the corner regions 110 have an L-shaped footprint. Each corner region 110 may have a first leg adjacent to a first edge of the stiffener 115 and a second leg adjacent to a second edge of the stiffener 115 that is adjacent to the first edge of the stiffener 115. In an embodiment, the interior angles of the corner regions 110 may not be ninety degree angles. As shown, an angled section connects the two legs together. However, in other embodiments, the corner regions 110 may have ninety degree interior angles. As shown, the legs of the corner regions 110 may not have widths that are substantially equal to the width of the beams 112. That is, portions of the beams 112 may wrap around the interior corners of the stiffener 115. In other embodiments, the widths of the legs of the corner regions 110 may be substantially equal to the width of the beams 112.

Figure 1D:
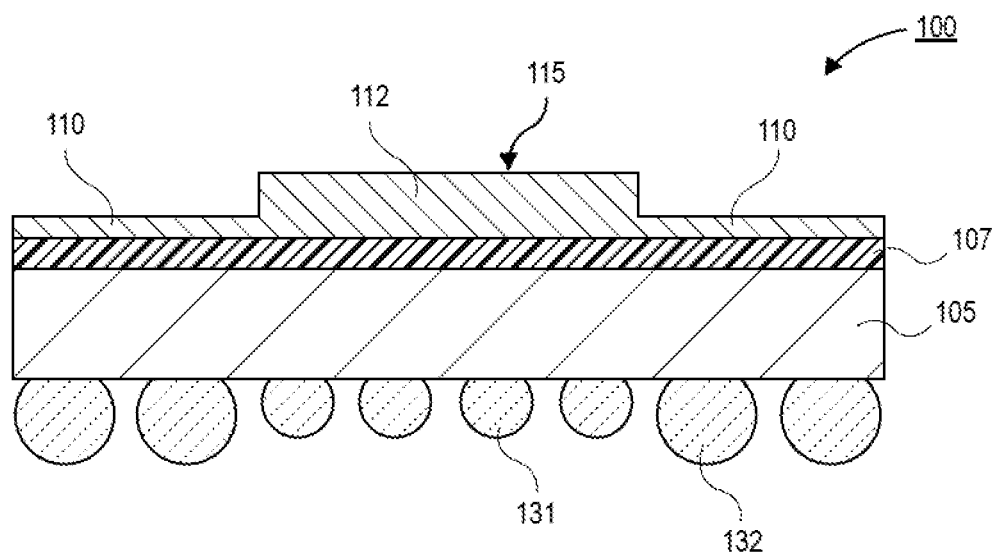
FIG. 1D is a cross-sectional illustration of an electronic package with a stiffener with corner regions with reduced thicknesses and larger solder balls below the corner regions, in accordance with an embodiment.

Referring now to FIG. 1D, a cross-sectional illustration of an electronic package 100 is shown, in accordance with an additional embodiment. In an embodiment, the electronic package 100 in FIG. 1D may be substantially similar to the electronic package 100 in FIG. 1B, with the exception of the formation of the solder balls 131. Instead of having uniform solder balls 131, a plurality of larger solder balls 132 may be included in the array. Particularly, the larger solder balls 132 may be provided under the corner regions 110. The larger solder balls 132 may be used to further reduce stresses in the corners of the BGA array. In an embodiment, the solder balls 131 and 132 may be the same material. In other embodiments, the solder balls 131 and 132 may be different materials.

In an embodiment, the larger solder balls 132 may be mechanical couplings only. That is, in some embodiments, the larger solder balls 132 may not be used for active circuitry in the electronic package 100. For example, the larger solder balls 132 may not be coupled to any active circuitry in the electronic package 100. Since the larger solder balls 132 are not part of the circuitry, if they short together (e.g., solder bump bridging), there is no damage to the circuitry of the electronic package 100.

Figure 2A:
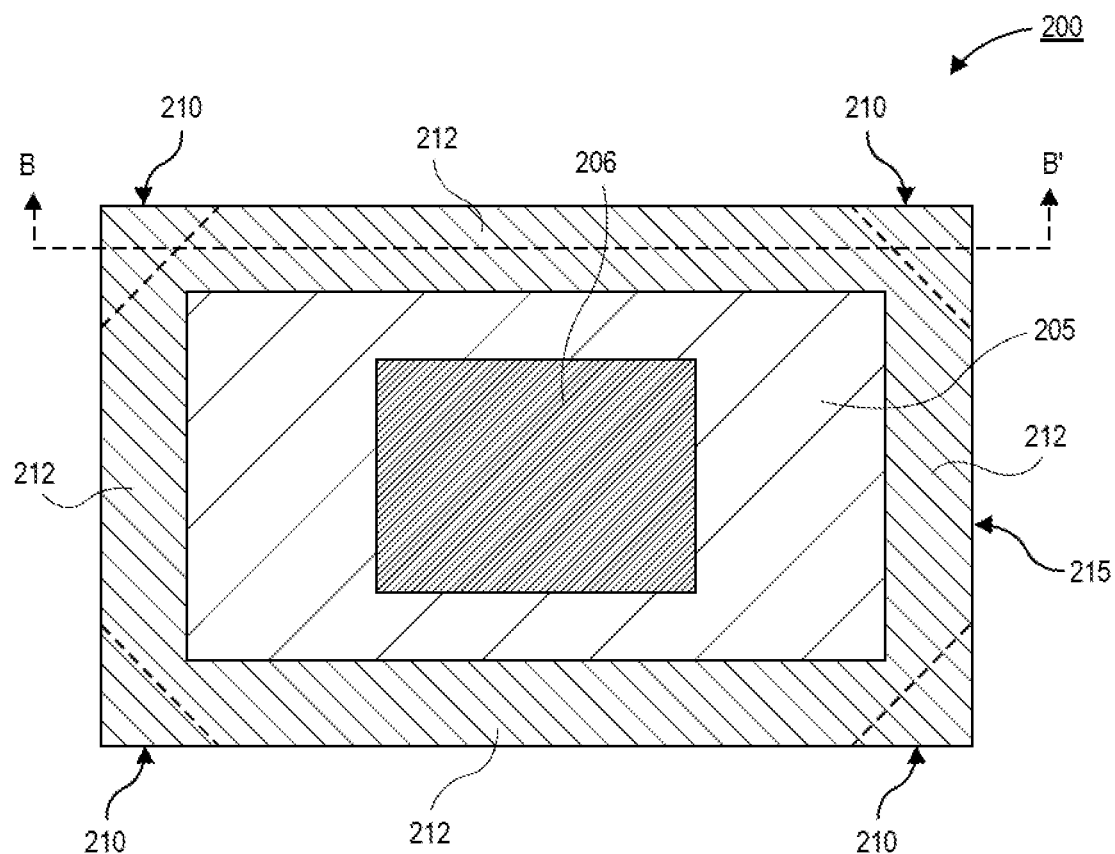
FIG. 2A is a plan view illustration of an electronic package with a stiffener that includes corner regions with recesses on a bottom surface of the stiffener, in accordance with an embodiment.

Referring now to FIG. 2A, a plan view illustration of an electronic package 200 is shown, in accordance with an embodiment. In an embodiment, the electronic package 200 may include a package substrate 205. The package substrate 205 may include a plurality of dielectric layers with conductive features (e.g., traces, vias, pads, etc.) embedded therein. In an embodiment, the package substrate 205 is coreless. In other embodiments, the package substrate 205 may include a core (e.g., a glass fiber reinforced dielectric layer).

In an embodiment, a die 206 may be coupled to the package substrate 205. The die 206 may be any type of active semiconductor device. For example, the die 206 may include a processor, a graphics processor, a memory, or the like. Additionally, while a single die 206 is shown in FIG. 2A, it is to be appreciated that multiple dies 206 may be provided adjacent to each other and/or in a vertical stack. In an embodiment, the die 206 may have a footprint that is smaller than a footprint of the package substrate 205. The die 206 may be coupled to the package substrate 205 with first level interconnects (FLIs), which are not visible in FIG. 2A.

In an embodiment, a stiffener 215 may be provided around a perimeter of the die 206. The stiffener 215 may be a ring that includes a center cutout in order to accommodate the die 206. The cutout may be larger than the footprint of the die 206. As such, portions of the package substrate 205 may be visible between the die 206 and the stiffener 215.

The stiffener 215 may have one or more corner regions 210. As shown, a set of four corner regions 210 are provided in the stiffener 215 of FIG. 2A. Each of the corner regions may be between beams 212. That is, beams 212 of the stiffener 215 may couple together adjacent corner regions 210. In an embodiment, the corner regions 210 may have a thickness that is less than a thickness of the beams 212. In a particular embodiment, the corner regions 210 may have a thickness that is half the thickness of the beams 212 or less. In some embodiments, the thickness of the corner regions 210 is a quarter or less of the thickness of the beams 212. As such, localized regions of the stiffener 215 can have small thicknesses in order to reduce BGA ball stress, while the remainder of the stiffener 215 remains thick in order to provide excellent warpage control for the underlying package substrate.

In contrast to the embodiments described in greater detail above, the recesses of the corner regions 210 are provided on the bottom surface of the stiffener 215. The location of the recesses on the bottom surface of the stiffener 215 is indicated by the use of a dashed line to illustrate the corner regions in FIG. 2A. In the illustrated embodiment, the corner regions 210 may be triangular corner regions 210. The triangular shape of the corner regions 210 may be substantially similar to the shape of the corner regions 110 described in greater detail above. The difference in FIG. 2A is that the corner regions 210 are on the bottom surface of the stiffener 215 instead of on the top surface of the stiffener 215.

Figure 2B:
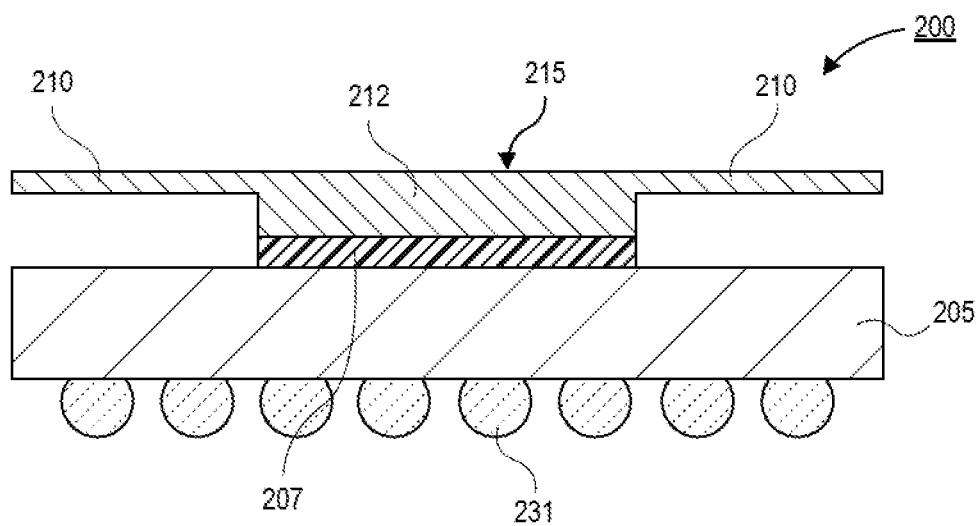
FIG. 2B is a cross-sectional illustration of an electronic package with a stiffener that includes corner regions with a recess on a bottom surface of the stiffener, in accordance with an embodiment.

Referring now to FIG. 2B, a cross-sectional illustration of the electronic package 200 in FIG. 2A along line B-B' is shown, in accordance with an embodiment. As shown, the stiffener 215 may be mechanically coupled to the package substrate 205 by an adhesive 207. The adhesive 207 may extend along a portion of the bottom surface of the stiffener 215. That is, the adhesive 207 may only be provided below the beam 212 and not the corner regions 210.

As shown, the stiffener 215 includes corner regions 210 that have a thickness that is less than a thickness of the beam 212. The thicknesses of the corner regions 210 may be reduced by providing recesses into the bottom surface of the corner regions 210. That is, the bottom surface of the beam 212 may be below the bottom surface of the corner regions 210. However, the top surface of the beam 212 may be substantially coplanar with a top surface of the corner regions 210.

In an embodiment, solder balls 231 may be provided on a bottom surface of the package substrate 205. The solder balls 231 may be BGA balls in some embodiments. The solder balls 231 may have substantially uniform spacings and dimensions. The reduction in the thickness of the corner regions 210 may result in the stress on the solder balls 231 being reduced, especially in the solder balls 231 that are provided under the corner regions 210.

Figure 2C:
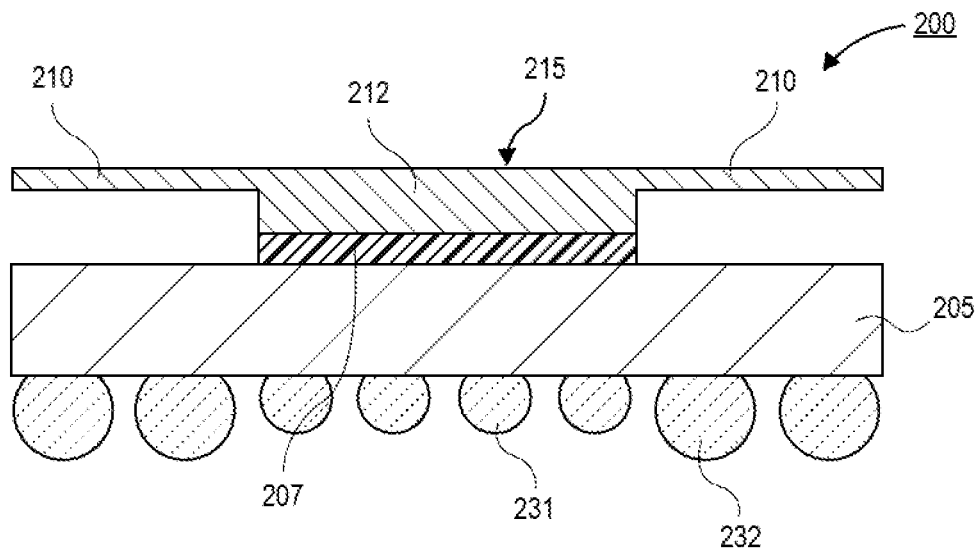
FIG. 2C is a cross-sectional illustration of an electronic package with a stiffener that includes corner regions with larger solder balls below the corner regions, in accordance with an embodiment.

Referring now to FIG. 2C, a cross-sectional illustration of an electronic package 200 is shown, in accordance with an additional embodiment. In an embodiment, the electronic package 200 in FIG. 2C may be substantially similar to the electronic package 200 in FIG. 2B, with the exception of the formation of the solder balls 231. Instead of having uniform solder balls 231, a plurality of larger solder balls 232 may be included in the array. Particularly, the larger solder balls 232 may be provided under the corner regions 210. The larger solder balls 232 may be used to further reduce stresses in the corners of the BGA array. In an embodiment, the solder balls 231 and 232 may be the same material. In other embodiments, the solder balls 231 and 232 may be different materials.

In an embodiment, the larger solder balls 232 may be mechanical couplings only. That is, in some embodiments, the larger solder balls 232 may not be used for active circuitry in the electronic package 200. For example, the larger solder balls 232 may not be coupled to any active circuitry in the electronic package 200. Since the larger solder balls 232 are not part of the circuitry, if they short together (e.g., solder bump bridging), there is no damage to the circuitry of the electronic package 200.

Figure 2D:
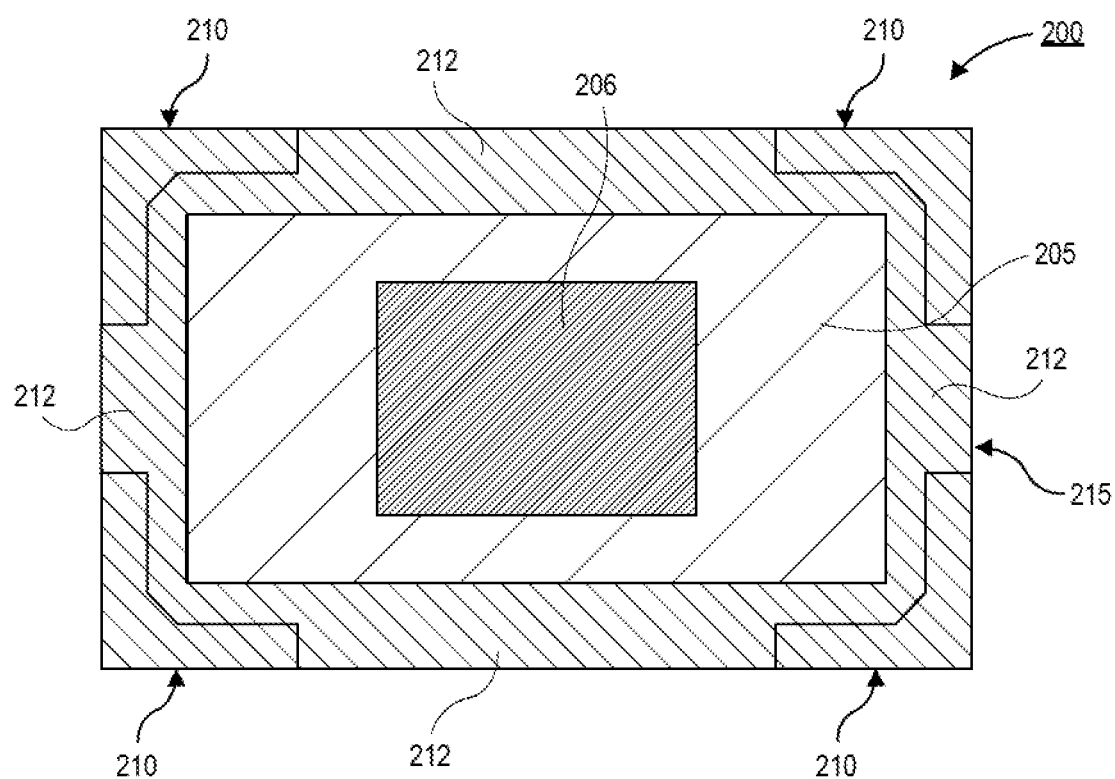
FIG. 2D is a plan view illustration of an electronic package with a stiffener that includes L-shaped corner regions with recesses on a bottom surface of the stiffener, in accordance with an embodiment.

Referring now to FIG. 2D, a plan view illustration of an electronic package 200 is shown, in accordance with an additional embodiment. In an embodiment, the electronic package 200 in FIG. 2D may be substantially similar to the electronic package 200 in FIG. 2A, with the exception of the shape of the corner regions 210. For example, the corner regions 210 have an L-shaped footprint. Each corner region 210 may have a first leg adjacent to a first edge of the stiffener 215 and a second leg adjacent to a second edge of the stiffener 215 that is adjacent to the first edge of the stiffener 215. In an embodiment, the interior angles of the corner regions 210 may not be ninety degree angles. As shown, an angled section connects the two legs together. However, in other embodiments, the corner regions 210 may have ninety degree interior angles. As shown, the legs of the corner regions 210 may not have widths that are substantially equal to the width of the beams 212. That is, portions of the beams 212 may wrap around the interior corners of the stiffener 215. In other embodiments, the widths of the legs of the corner regions 210 may be substantially equal to the width of the beams 212. Similar to above, the corner regions 210 are recesses formed into the bottom surface of the stiffener 215. The positioning of the corner regions 210 on the bottom surface of the stiffener 215 is indicated by the use of dashed lines for the corner regions 210.

Figure 3A:
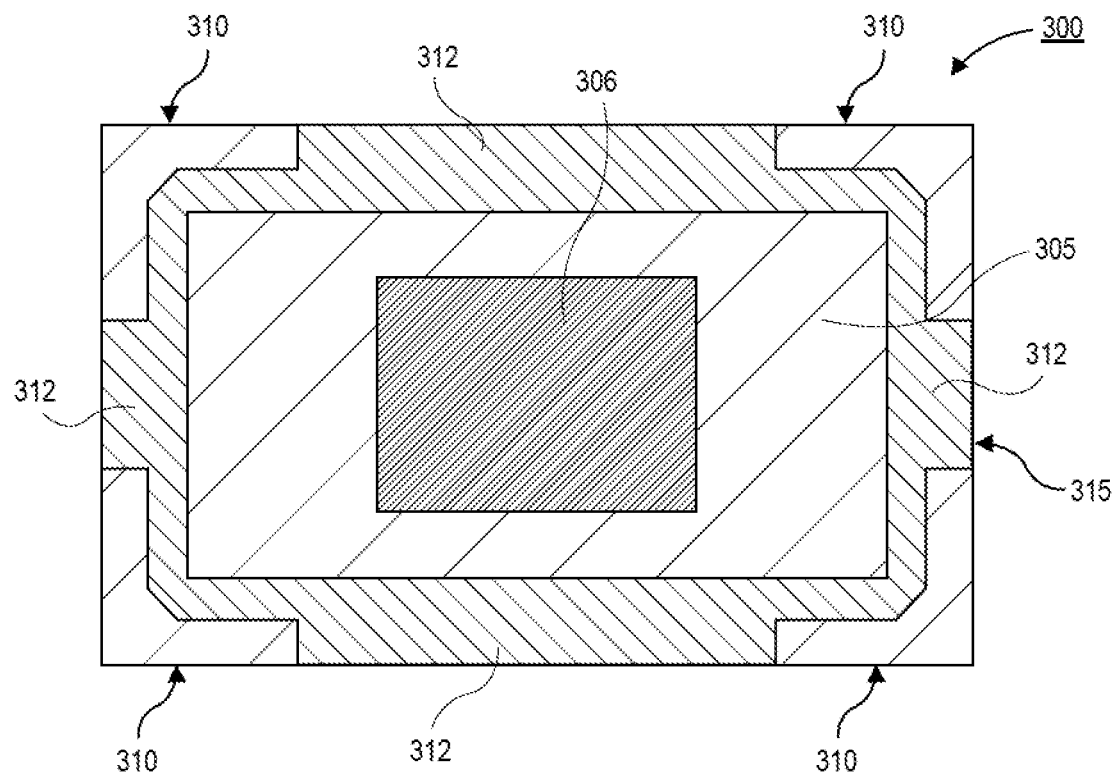
FIG. 3A is a plan view illustration of an electronic package with a stiffener that includes corner cutouts, in accordance with an embodiment.

Referring now to FIG. 3A, a plan view illustration of an electronic package 300 is shown, in accordance with an embodiment. In an embodiment, the electronic package 300 may be substantially similar to the electronic package 100 in FIG. 1C, with the exception of the corner regions 310. For example, the electronic package 300 includes a package substrate 305 and a die 306. A stiffener 315 with beams 312 and corner regions 310 is provided around the die 306. However, instead of being a recess that partially passes through the stiffener 315, the corner regions 310 are cutouts that pass entirely through a thickness of the stiffener 315. As such, the package substrate 305 is exposed in the corner regions 310. In the illustrated embodiment, the corner regions 310 are L-shaped. However, in other embodiments, corner regions 310 that pass entirely through a thickness of the stiffener 315 may be triangle shaped, similar to embodiments described in greater detail above.

Figure 3B:
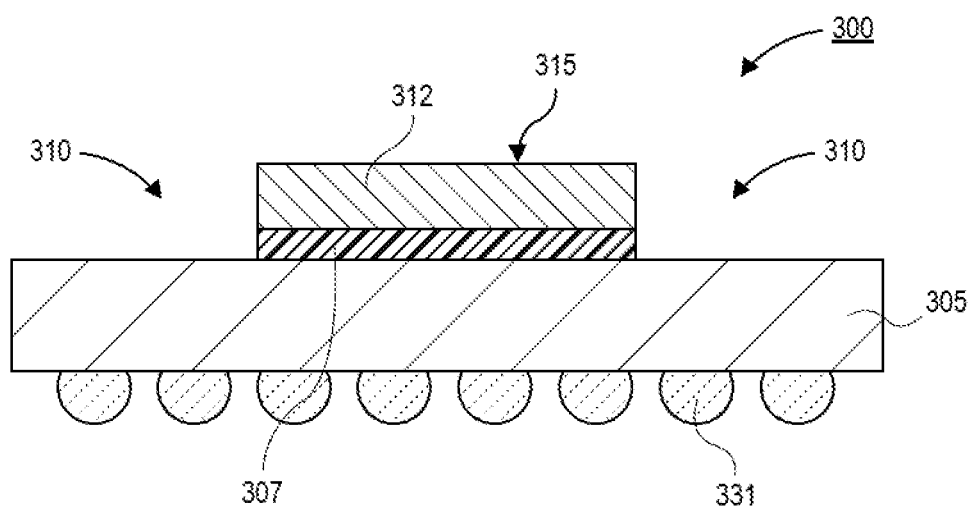
FIG. 3B is a cross-sectional illustration of an electronic package with a stiffener that includes corner cutouts, in accordance with an embodiment.

Referring now to FIG. 3B, a cross-sectional illustration of the electronic package 300 in FIG. 3A is shown, in accordance with an embodiment. As shown, the stiffener 315 is coupled to the package substrate 305 by an adhesive 307. The cutouts of the corner regions 310 do not include portions of the stiffener 315. As such, the package substrate 305 is exposed. Solder balls 331 may be provided under the package substrate 305. In the illustrated embodiment, all of the solder balls 331 have the same dimensions. However, in some embodiments, larger solder balls may be provided below the corner regions, similar to embodiments described in greater detail above.

Figure 4A:
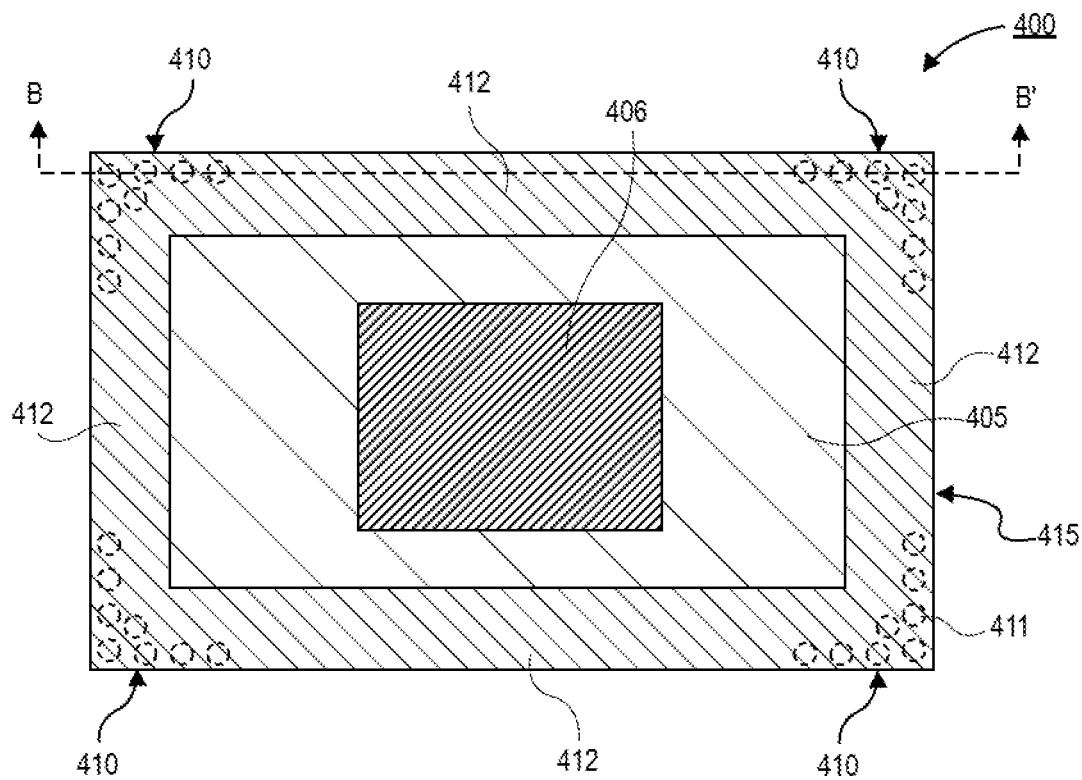
FIG. 4A is a plan view illustration of an electronic package with a stiffener that includes corner regions with a plurality of recesses, in accordance with an embodiment.

Referring now to FIG. 4A, a plan view illustration of an electronic package 400 is shown, in accordance with an additional embodiment. In an embodiment, the electronic package 400 includes a package substrate 405 and a die 406. The package substrate 405 and the die 406 may be similar to package substrates and dies described in greater detail above. In an embodiment, a stiffener 415 may be provided over the package substrate 405 and around the die 406. In an embodiment, the stiffener 415 includes beams 412 and corner regions 410. In an embodiment, the corner regions 410 include a plurality of recesses 411. As shown, the outline of the recesses 411 are shown as being dashed in order to indicate that they are formed into the bottom surface of the stiffener 415. However, in other embodiments, the recesses 411 may be formed into the top surface of the stiffener 415.

Figure 4B:
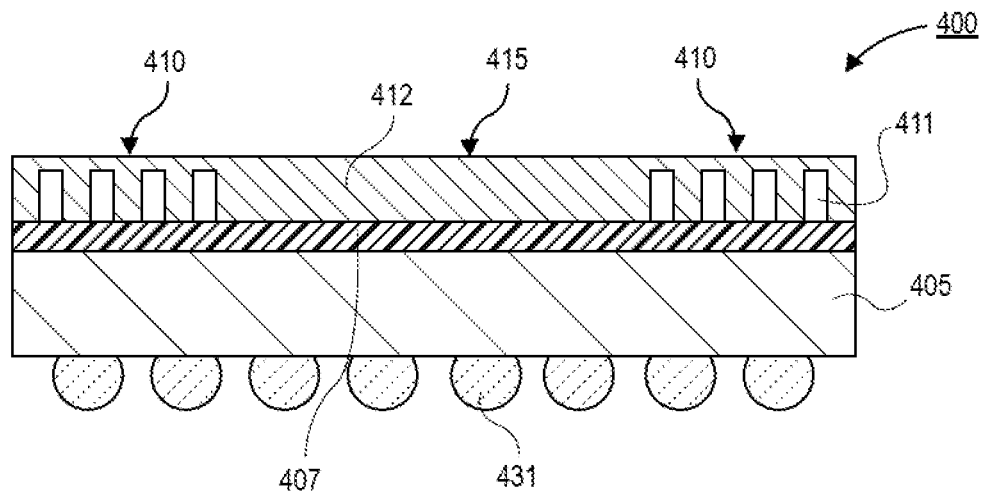
FIG. 4B is a cross-sectional illustration of an electronic package with a stiffener that includes corner regions with a plurality of recesses, in accordance with an embodiment.

Referring now to FIG. 4B, a cross-sectional illustration of the electronic package 400 in FIG. 4A along line B-B' is shown, in accordance with an embodiment. In an embodiment, the electronic package 400 comprises a package substrate 405 that is coupled to a stiffener 415 by an adhesive 407. The stiffener 415 may include a beam 412 and corner regions 410. As shown, a plurality of recesses 411 are provided into the bottom surface of the stiffener 415 in the corner region 410. In an embodiment, solder balls 431 may be provided on the bottom surface of the package substrate 405. The solder balls 431 may have a uniform size and pitch.

Figure 4C:
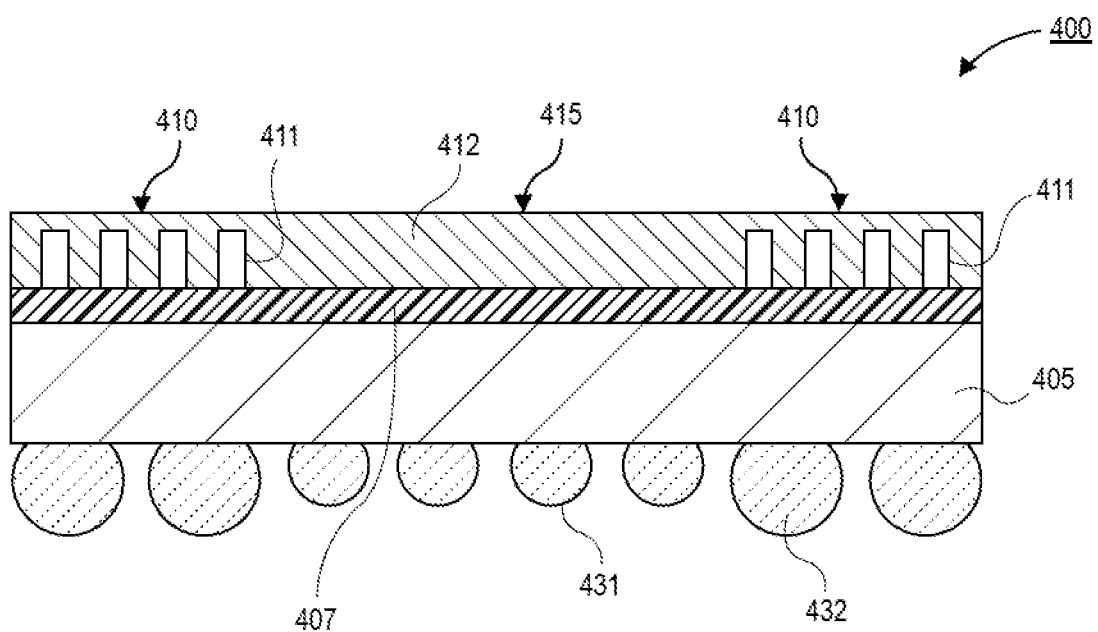
FIG. 4C is a cross-sectional illustration of an electronic package with a stiffener that includes corner regions with a plurality of recesses with larger solder balls below the corner regions, in accordance with an embodiment.

Referring now to FIG. 4C, a cross-sectional illustration of an electronic package 400 is shown, in accordance with an additional embodiment. The electronic package 400 in FIG. 4C may be substantially similar to the electronic package 400 in FIG. 4B, with the exception of the solder balls 431. As shown, larger solder balls 432 may be provided below the corner regions 410. The larger solder balls 431 may be mechanical connectors only in some embodiments. That is, the larger solder balls 431 may not be coupled to electrical circuitry of the electronic package 400.

Figure 5A:
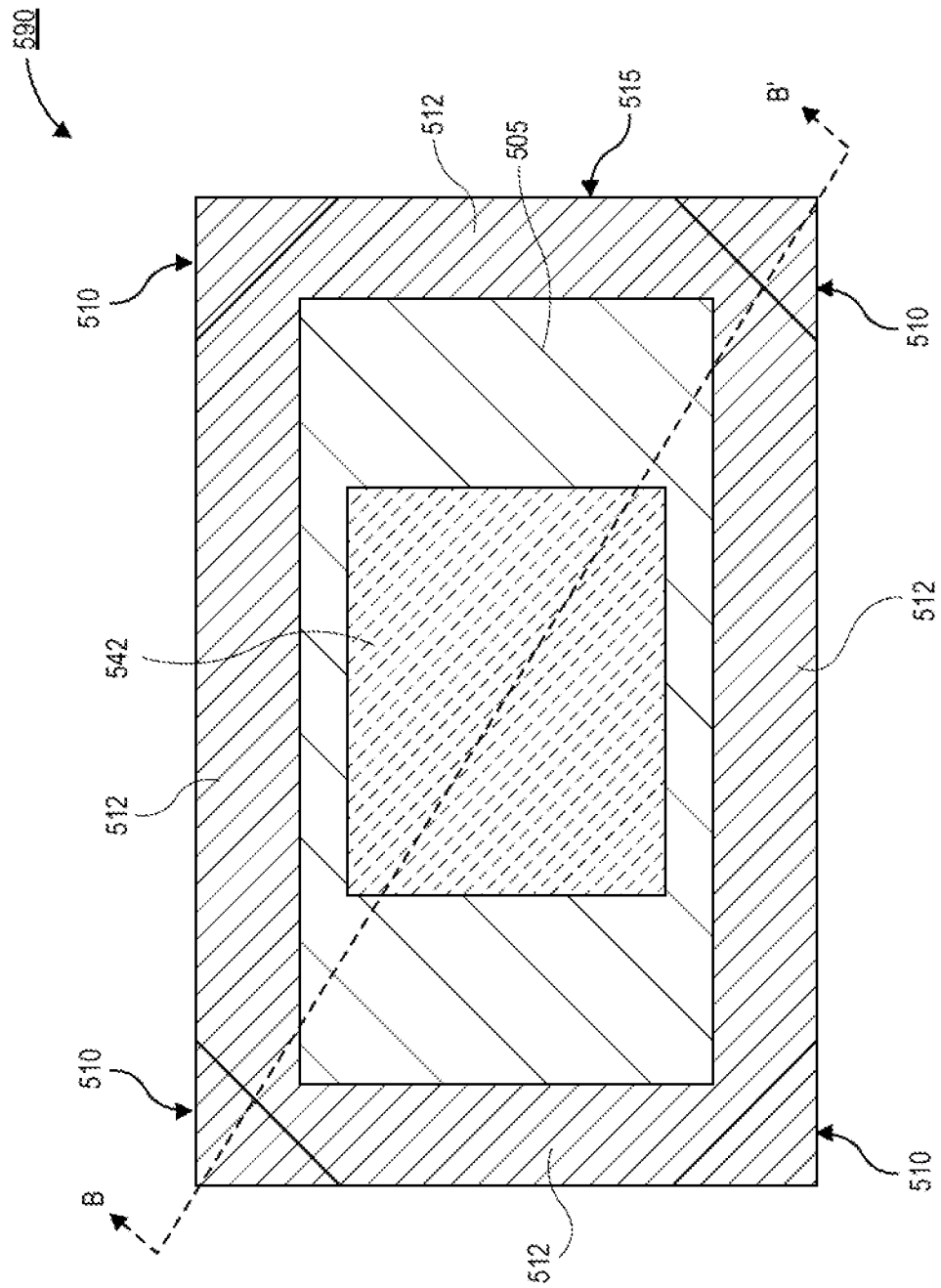
FIG. 5A is a plan view illustration of an electronic system with a stiffener that has corner regions with reduced thicknesses, in accordance with an embodiment.

Referring now to FIG. 5A, a plan view illustration of an electronic system 590 is shown, in accordance with an embodiment. In an embodiment, the electronic system 590 comprises a package substrate 505. A die with an integrated heat spreader (IHS) 542 is provided over the package substrate 505. A stiffener 515 may be provided on the package substrate 505 around the die and the IHS 542.

As shown, the stiffener 515 may include beams 512 and corner regions 510. In the illustrated embodiment, the corner regions 510 are triangular recesses into the top surface of the stiffener 515. However, it is to be appreciated that the corner regions 510 may be similar to any of the corner regions described in greater detail above. For example, the corner regions 510 may be L-shaped, a plurality of recesses, and/or formed into the bottom surface of the stiffener 515.

Figure 5B:
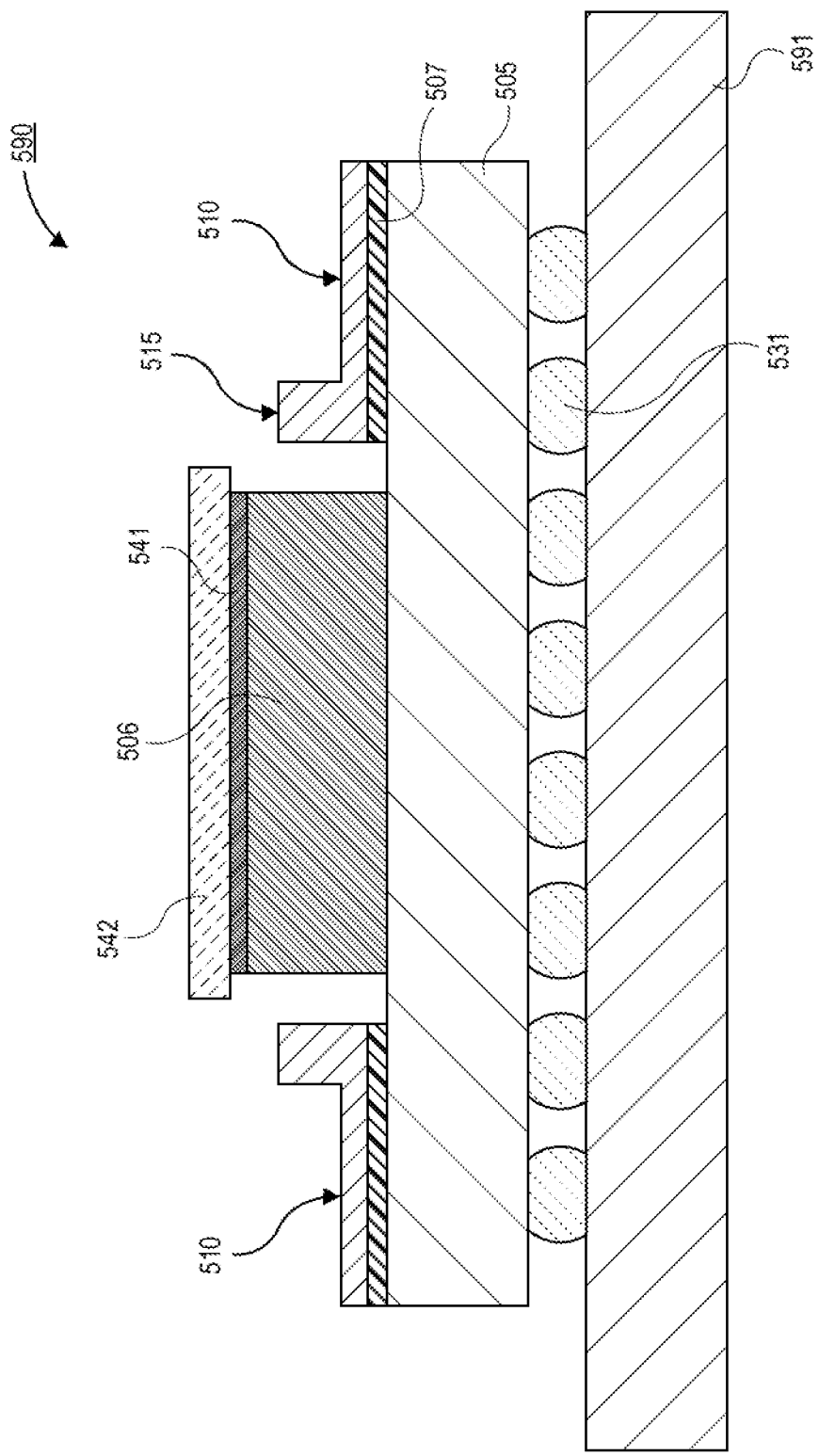
FIG. 5B is a cross-sectional illustration of an electronic system with a stiffener that has corner regions with reduced thicknesses, in accordance with an embodiment.

Referring now to FIG. 5B, a cross-sectional illustration of the electronic system 590 in FIG. 5A along line B-B' is shown, in accordance with an embodiment. As shown, the die 506 is provided over the package substrate 505. The die 506 may be coupled to the package substrate 505 with any FLI architecture (not shown for simplicity). In an embodiment, the IHS 542 is coupled to the top surface of the die 506 by a thermal interface material (TIM) 541. In an embodiment, the stiffener 515 surrounds a perimeter of the die 506. The stiffener 515 may be coupled to the package substrate 505 by an adhesive 507 or the like. Corner regions 510 have a thickness that is less than the thickness of the remainder of the stiffener 515.

In an embodiment, a plurality of solder balls 531 are coupled to a board 591, such as a printed circuit board (PCB). In an embodiment, the solder balls 531 are all the same dimension and have a uniform pitch. In other embodiments, the solder balls 531 below the corner regions 510 may be larger than the remainder of the solder balls 531, similar to embodiments described in greater detail above.

Figure 6:
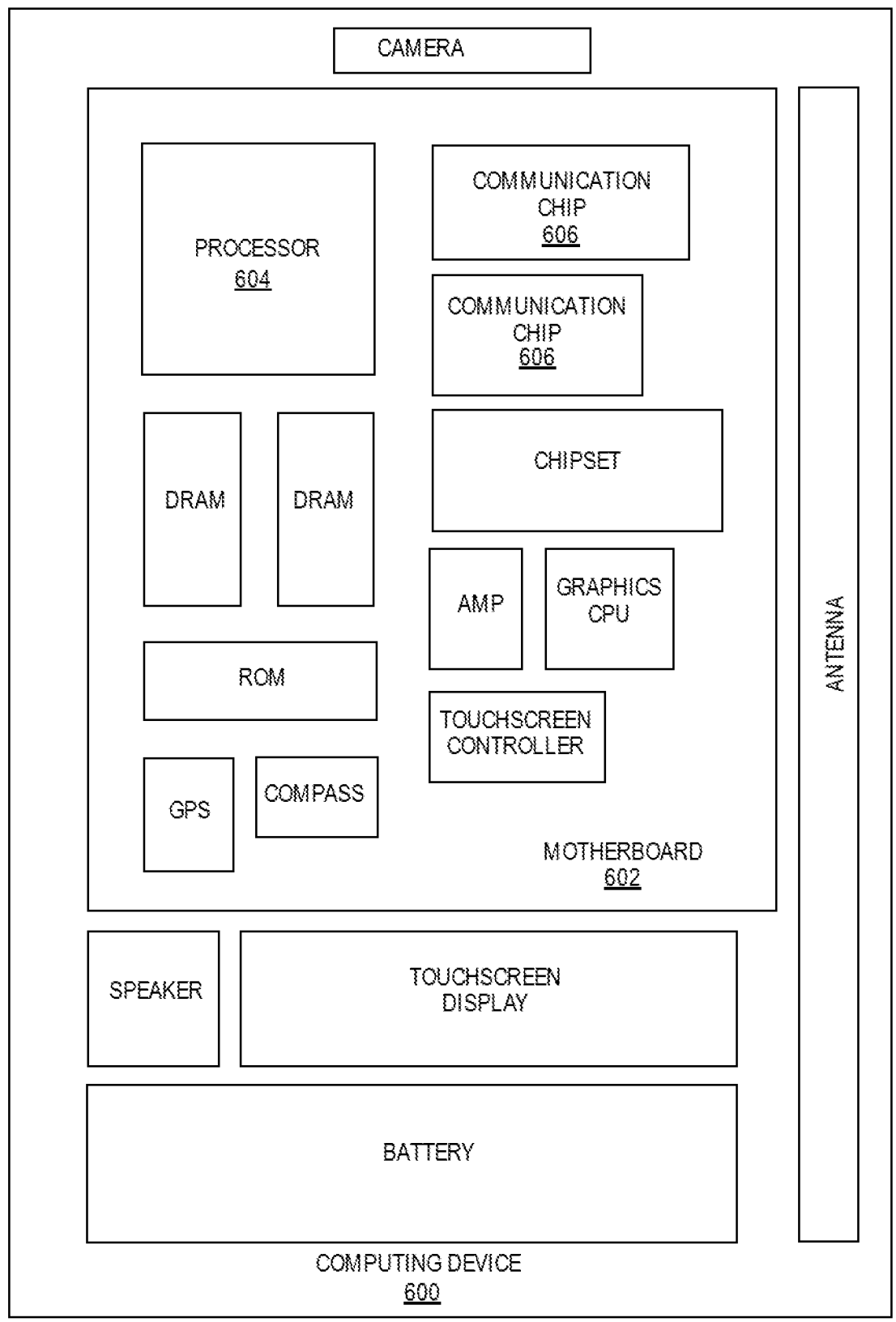
FIG. 6 is a schematic of a computing device built in accordance with an embodiment.

FIG. 6 illustrates a computing device 600 in accordance with one implementation of the invention. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. In some implementations of the invention, the integrated circuit die of the processor may be part of an electronic package that includes a stiffener with corner regions that are thinner than a remainder of the stiffener, in accordance with embodiments described herein. The term "processor" may refer to any device or portion of a device that processes electronic data from registers and/or memory to transform that electronic data into other electronic data that may be stored in registers and/or memory.

The communication chip 606 also includes an integrated circuit die packaged within the communication chip 606. In accordance with another implementation of the invention, the integrated circuit die of the communication chip may be part of an electronic package that includes a stiffener with corner regions that are thinner than a remainder of the stiffener, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: an electronic package, comprising: a package substrate; a die coupled to the package substrate; and a stiffener on the package substrate surrounding the die, wherein the stiffener is a ring with one or more corner regions and one or more beams, wherein each beam is between a pair of corner regions, and wherein the one or more corner regions have a first thickness and the one or more beams have a second thickness that is greater than the first thickness.

Example 2: the electronic package of Example 1, wherein the one or more corner regions have a triangular footprint.

Example 3: the electronic package of Example 1, wherein the one or more corner regions have an L-shaped footprint.

Example 4: the electronic package of Examples 1-3, wherein each of the one or more corner regions includes a plurality of recesses.

Example 5: the electronic package of Example 4, wherein the plurality of recesses are circular recesses.

Example 6: the electronic package of Examples 1-5, wherein the second thickness is at least twice the first thickness.

Example 7: the electronic package of Examples 1-6, wherein the one or more corner regions have a bottom surface that is substantially coplanar with a bottom surface of the one or more beams.

Example 8: the electronic package of Examples 1-7, wherein the one or more corner regions have a top surface that is substantially coplanar with a top surface of the one or more beams.

Example 9: the electronic package of Examples 1-8, wherein the one or more corner regions comprises four corner regions.

Example 10: the electronic package of Examples 1-9, further comprising: solder balls under the package substrate.

Example 11: the electronic package of Example 10, wherein first solder balls are below the one or more corner regions and second solder balls are below the one or more beams and/or the die.

Example 12: the electronic package of Example 11, wherein the first solder balls have a higher volume than the second solder balls.

Example 13: the electronic package of Example 12, wherein the first solder balls are not coupled to active circuitry of the electronic package.

Example 14: the electronic package of Examples 1-13, wherein the stiffener is coupled to the package substrate by an adhesive.

Example 15: a stiffener for an electronic package, comprising: a ring, wherein the ring includes a top surface and a bottom surface; and recesses into the ring at one or more corner locations of the ring, wherein the recesses reduce a thickness of the ring at the one or more corner locations.

Example 16: the stiffener of Example 15, wherein the recesses are formed into the top surface of the ring.

Example 17: the stiffener of Example 15, wherein the recesses are formed into the bottom surface of the ring.

Example 18: the stiffener of Examples 15-17, wherein the recesses are triangular shaped recesses.

Example 19: the stiffener of Examples 15-17, wherein the recesses are L-shaped recesses.

Example 20: the stiffener of Examples 15-19, wherein the one or more corner locations each include a plurality of recesses.

Example 21: the stiffener of Example 20, wherein the plurality of recesses are circular recesses.

Example 22: the stiffener of Examples 15-21, wherein the recess passes through an entire thickness from the top surface to the bottom surface.

Example 23: an electronic system, comprising: a board; a package substrate coupled to the board; a die coupled to the package substrate; and a stiffener around the die on the package substrate, wherein the stiffener comprises a ring with corner regions, and wherein the corner regions have a first thickness that is less than a second thickness of beams between the corner regions.

Example 24: the electronic system of Example 23, wherein the corner regions include recesses into a top surface of the stiffener.

Example 25: the electronic system of Example 23, wherein the corner regions include recesses into a bottom surface of the stiffener.

What is claimed is:

1. An electronic package, comprising:
a package substrate;
a die coupled to the package substrate; and
a stiffener on the package substrate and laterally surrounding the die, wherein the stiffener is a ring with one or more corner regions and one or more beams, wherein each beam is between a pair of corner regions, and wherein the one or more corner regions have a first thickness and the one or more beams have a second thickness that is greater than the first thickness.

2. The electronic package of claim 1, wherein the one or more corner regions have a triangular footprint.

3. The electronic package of claim 1, wherein the one or more corner regions have an L-shaped footprint.

4. The electronic package of claim 1, wherein each of the one or more corner regions includes a plurality of recesses.

5. The electronic package of claim 4, wherein the plurality of recesses are circular recesses.

6. The electronic package of claim 1, wherein the second thickness is at least twice the first thickness.

7. The electronic package of claim 1, wherein the one or more corner regions have a bottom surface that is substantially coplanar with a bottom surface of the one or more beams.

8. The electronic package of claim 1, wherein the one or more corner regions have a top surface that is substantially coplanar with a top surface of the one or more beams.

9. The electronic package of claim 1, wherein the one or more corner regions comprises four corner regions.

10. The electronic package of claim 1, further comprising: solder balls under the package substrate.

11. The electronic package of claim 10, wherein first solder balls are below the one or more corner regions and second solder balls are below the one or more beams and/or the die.

12. The electronic package of claim 11, wherein the first solder balls have a higher volume than the second solder balls.

13. The electronic package of claim 12, wherein the first solder balls are not coupled to active circuitry of the electronic package.

14. The electronic package of claim 1, wherein the stiffener is coupled to the package substrate by an adhesive.

15. A stiffener for an electronic package, comprising:
a ring laterally surrounding a die location, wherein the ring includes a top surface and a bottom surface; and
recesses into the ring at one or more corner locations of the ring, wherein the recesses reduce a thickness of the ring at the one or more corner locations.

16. The stiffener of claim 15, wherein the recesses are formed into the top surface of the ring.

17. The stiffener of claim 15, wherein the recesses are formed into the bottom surface of the ring.

18. The stiffener of claim 15, wherein the recesses are triangular shaped recesses.

19. The stiffener of claim 15, wherein the recesses are L-shaped recesses.

20. The stiffener of claim 15, wherein the one or more corner locations each include a plurality of recesses.

21. The stiffener of claim 20, wherein the plurality of recesses are circular recesses.

22. The stiffener of claim 15, wherein the recess passes through an entire thickness from the top surface to the bottom surface.

23. An electronic system, comprising:
a board;
a package substrate coupled to the board;
a die coupled to the package substrate; and
a stiffener laterally surrounding the die on the package substrate, wherein the stiffener comprises a ring with corner regions, and wherein the corner regions have a first thickness that is less than a second thickness of beams between the corner regions.

24. The electronic system of claim 23, wherein the corner regions include recesses into a top surface of the stiffener.

25. The electronic system of claim 23, wherein the corner regions include recesses into a bottom surface of the stiffener.

* * * * *